(12) United States Patent
Cordes et al.

(10) Patent No.: US 9,699,944 B2
(45) Date of Patent: *Jul. 4, 2017

(54) METHODS AND DEVICES FOR REDUCING COMMUNICATION AND POWER SIGNAL LEAKAGES FROM FILTER ASSEMBLIES

(71) Applicant: InTech Defense, LLC, McLean, VA (US)

(72) Inventors: Marc Cordes, Arlington, VA (US); Paul LaHaye, Arnold, MD (US)

( * ) Notice: Subject to any disclaimer, the term of this patent is extended or adjusted under 35 U.S.C. 154(b) by 70 days.

This patent is subject to a terminal disclaimer.

(21) Appl. No.: 14/466,987

(22) Filed: Aug. 23, 2014

(65) Prior Publication Data

US 2016/0057895 A1 Feb. 25, 2016

(51) Int. Cl.
*H05K 9/00* (2006.01)

(52) U.S. Cl.
CPC ......... *H05K 9/0041* (2013.01); *H05K 9/0018* (2013.01)

(58) Field of Classification Search
CPC .................... H05K 9/0041; H05K 9/0018
USPC ........... 361/816, 679.01, 807, 818, 820, 829
See application file for complete search history.

(56) References Cited

U.S. PATENT DOCUMENTS

| 4,641,224 | A | 2/1987 | Reimer |
| 5,012,042 | A | 4/1991 | Summach |
| 5,175,673 | A | 12/1992 | Roger et al. |
| 5,576,513 | A | 11/1996 | Günther et al. |
| 6,037,846 | A | 3/2000 | Oberhammer |
| 6,121,696 | A | 9/2000 | Chen |
| 6,211,457 | B1 | 4/2001 | Cama et al. |
| 6,642,811 | B2 | 11/2003 | Daniels et al. |
| 6,660,933 | B2 | 12/2003 | Festag |
| 7,411,784 | B2 | 8/2008 | Coglitore et al. |
| 2008/0164059 | A1 | 7/2008 | Cipolla |

FOREIGN PATENT DOCUMENTS

GB 2184293 6/1987

*Primary Examiner* — Tremesha S Willis
(74) *Attorney, Agent, or Firm* — Capitol Patent & Trademark Law Firm, PLLC

(57) ABSTRACT

Novel assemblies for use in conjunction with RF shielded enclosures and the like include one or more RF power and signal filters connectibly inserted, attached to, or otherwise made a part of optimized cavities or receptacles formed within an optimized frame of the assembly. The use of optimized cavities or receptacles greatly reduces the number of exterior fasteners needed to connect filters to the assembly or the assembly to an enclosure which, in turn, reduces leakage. The optimized cavities or receptacles may be arranged in a compact manner in order to make optimum use of the available space on an optimized frame of the assembly.

25 Claims, 11 Drawing Sheets

FIG. 8B
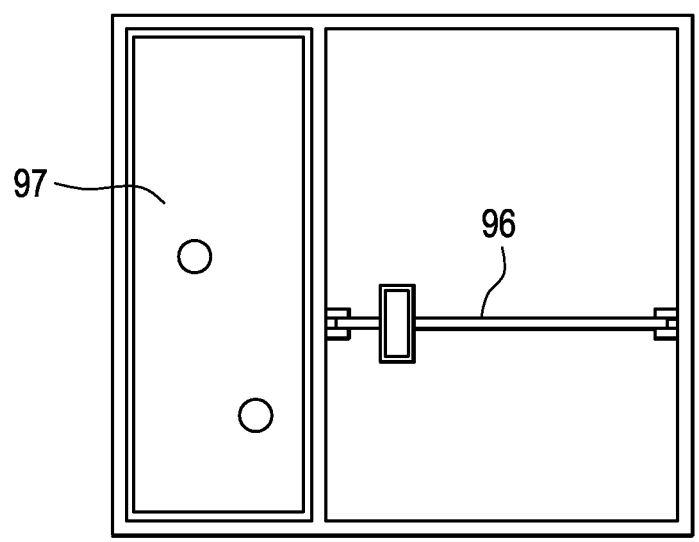
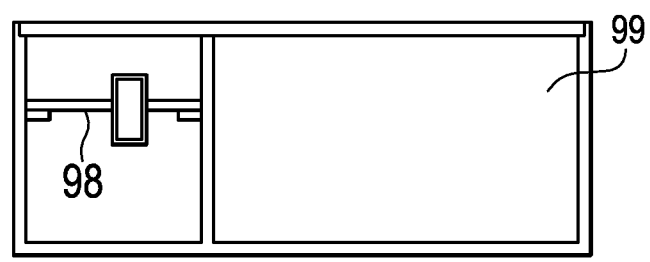

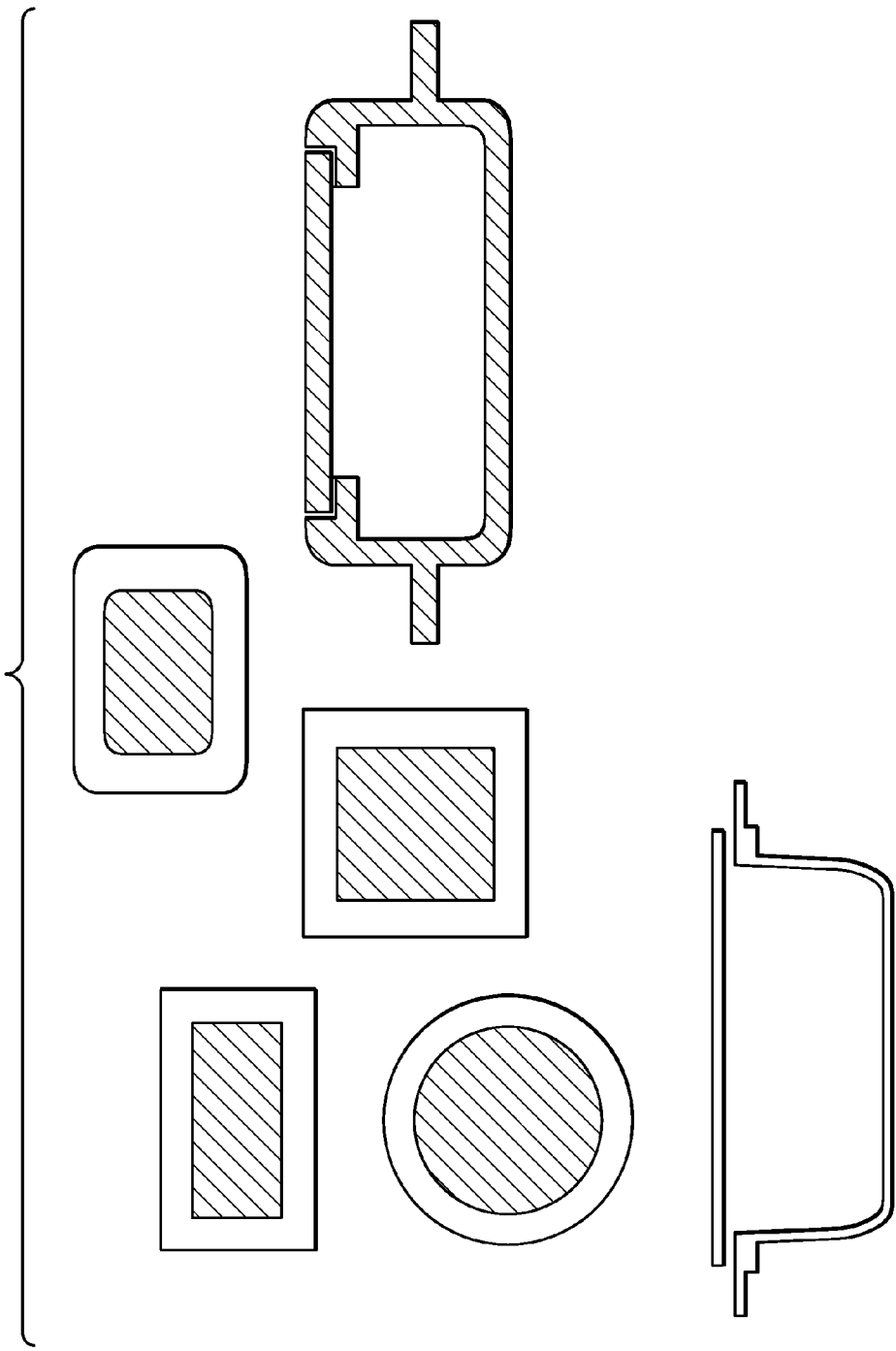

METHODS AND DEVICES FOR REDUCING COMMUNICATION AND POWER SIGNAL LEAKAGES FROM FILTER ASSEMBLIES

RELATED APPLICATIONS

This application is a continuation of, and claims priority from, U.S. patent application Ser. No. 12/703,712 filed Feb. 10, 2010 (the '712 Application). The '712 Application claims priority from U.S. Provisional Application No. 61/150,989 filed Feb. 9, 2009 (the '989 Application). The instant application incorporates by reference herein as if set forth in full herein the disclosures of both the '712 and '989 Applications.

BACKGROUND OF THE INVENTION

Keeping communications secret from an adversary or competitor has long been the challenge of the military, agencies of the federal government as well companies that are targets of corporate espionage. The challenge becomes even more difficult when communications are made from locations that do not have structures that have been built to prevent eavesdropping and the like, such as when a member of the presidential cabinet, foreign service or military travels to a foreign country, works in an embassy built by some other country or travels to a locale within the United States that is not considered secure from a communications point of view.

One method of ensuring that communications remain secure in the situations described above, and others, is to put communications equipment inside a portable, shielded enclosure. One example is a tent made from a special fabric that prevents eavesdropping and leakage of communication signals (e.g., radio frequency, "RF", signals). Whenever communications need to be secure, an individual walks into the enclosure, closes the enclosure and uses the communications equipment installed within the enclosure to send and receive communications.

Though such enclosures make it more difficult to conduct eavesdropping and reduce potential leakage of signals, they are not fool proof. For example, though the equipment inside the enclosure may be secure such equipment must receive sufficient power from the outside. Further, if communications are conducted over wired links such wires must be connected through the walls or "skin" (i.e., surfaces) of the enclosure.

Existing enclosures include an access panel or opening through which power and signal wires may pass. Because eavesdropping and leakage is possible through such an opening and over such wires a specially designed filter assembly is used. The assembly is designed to be attached to, and fit into, the opening. Once installed in the opening the signal and power wires from the outside are connected to the exterior side of the assembly while interior wires leading to communications equipment and the like are connected to the interior side of the assembly. Existing assemblies include a specially designed and machined metal frame. Attached to the frame are specially designed electronic and electrical filters. Once attached to the frame, the filters are then placed between the exterior and interior wires to ensure that unwanted communication or power signals are not allowed to pass into the enclosure and unsecure communication signals are not allowed to escape.

Existing assemblies require the use of many fasteners, such as screws and bolts to fasten the filters to the metal frame. FIG. 1 depicts an example of an existing assembly 1. As shown, sixteen screws 2 must be used to install a flange 3 to the frame 4. The flange 3 is needed to make sure a power filter 5 is physically connected to the assembly 1. The danger is that communication signals may leak out from within the enclosure through the small openings formed by each screw 2. Given the sophistication of today's eavesdropping techniques, even small leaks can provide an adversary with enough information to place people's lives at risk.

Accordingly, what is needed are improved methods and devices for reducing communication and power signal leakages from filter assemblies, shielded enclosures and the like.

SUMMARY OF THE INVENTION

The present inventors discovered that the risk of leakage could be reduced by, among other things, reducing the number of fasteners needed to connect filters to an assembly. In one embodiment of the invention, one or more filters or other components may be connectibly inserted, attached to, or otherwise made a part of, an optimized frame of an assembly by first forming one or more optimized cavities or receptacles in the frame and then inserting, etc., one or more of the filters into a formed cavity or receptacle. The use of optimized cavities or receptacles greatly reduces the number of exterior fasteners needed to connect components to an assembly which, in turn, reduces leakage.

Additional embodiments of the invention, which provide additional improvements over existing assemblies, are described below.

BRIEF DESCRIPTION OF THE DRAWINGS

FIGS. 8A and 8B depict embodiments of the invention using one or more alternative bulkheads.

FIGS. 9A, 9B and 10 depict alternative geometrical designs for assemblies according to embodiments of the invention.

DETAILED DESCRIPTION OF THE INVENTION

Figure 1:
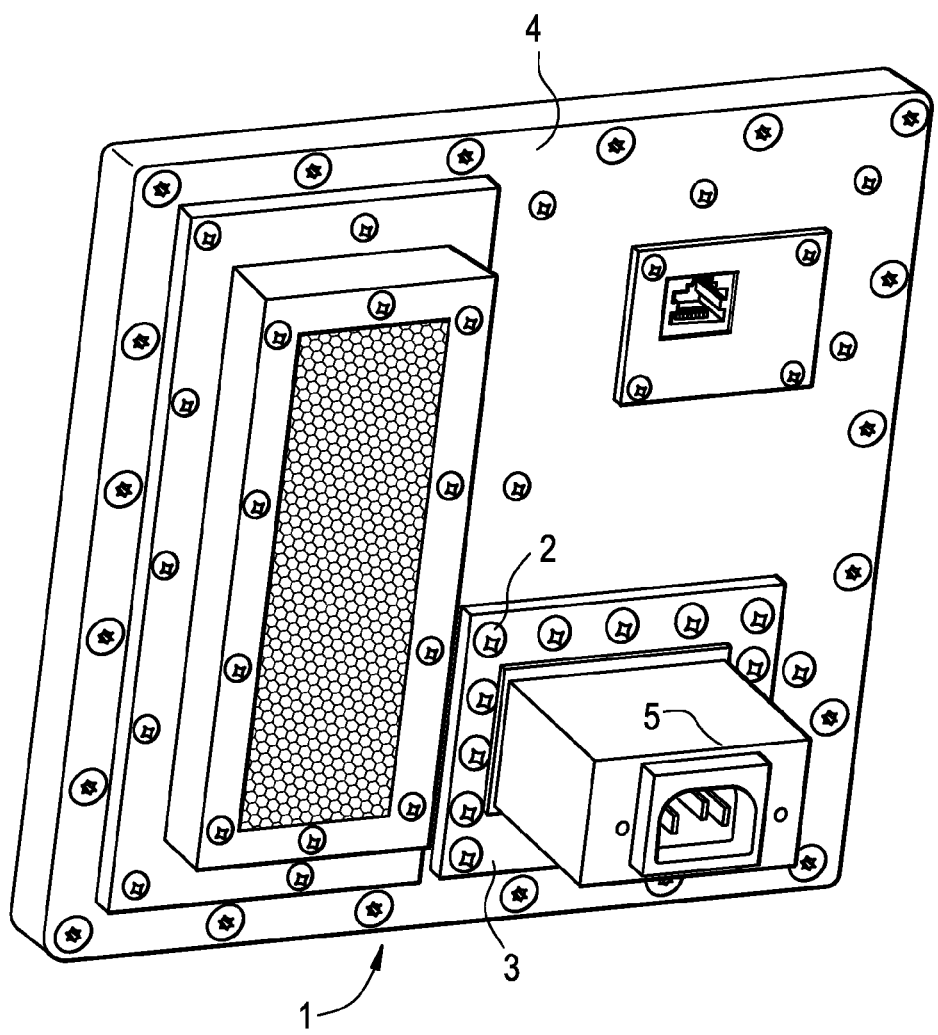
FIG. 1 depicts an example of an existing assembly.
Figure 2:
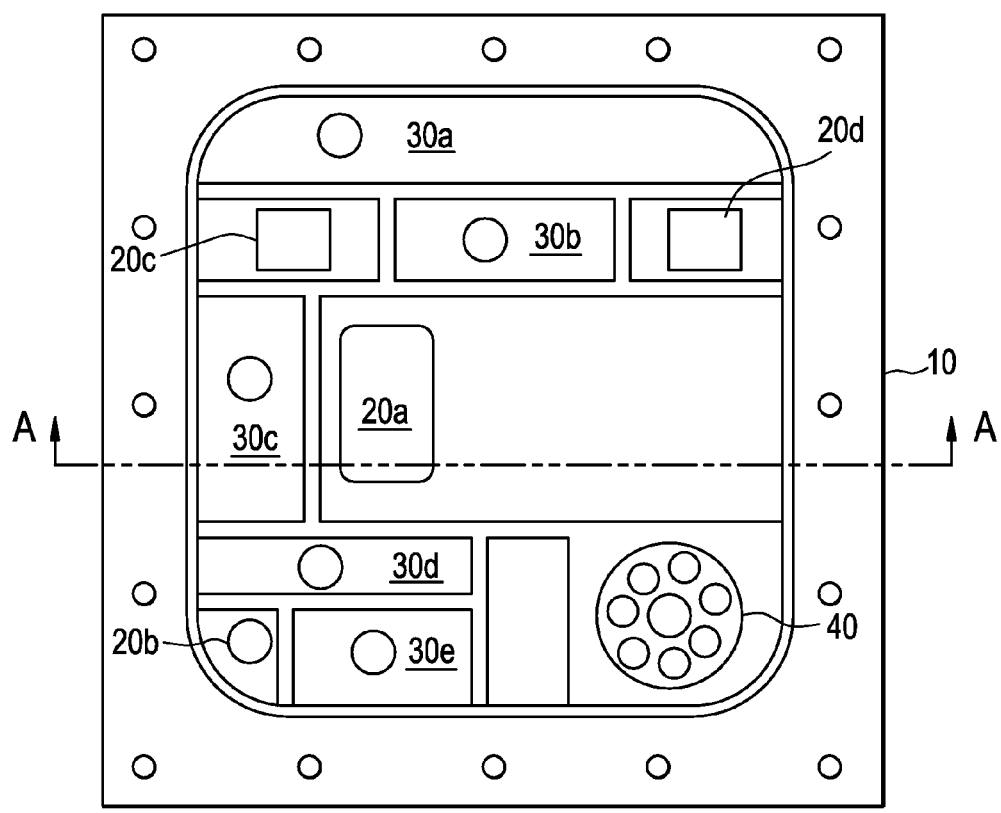
FIGS. 2 and 3 depict examples of optimized frames used as a part of assemblies which include one or more optimized cavities or receptacles according to embodiments of the invention.

Referring now to FIG. 2, there is shown one example of a frame 10 which may part of an assembly according to one embodiment of the invention. As shown, the frame 10 includes one or more cavities or receptacles (collectively referred to as "cavities" or "cavity") 20a-20d and 30a-30e. At any given time some cavities, such as cavities 20a-20d, may receive one or more components (e.g., power filters, electrical connectors and components, optical connectors and components, radio-frequency identification (RFID) microchips and a registered-jack (RJ) type telecommunication jacks) which are intended to be, or are, connectibly inserted into, attached to, or otherwise placed into, a cavity. The inclusion of an RFID chip in a machined cavity on, for example, the outside of the assembly may allow for the identification, tracking, etc., of one or more of the other components within an assembly. Further, other cavities, such as cavities 30a-30e, may be used as spare cavities (i.e., available to receive one or more components in the future).

It should be understood that any number of filters and other electronic, mechanical, optical, electrical components (to name just a few examples) may be connectibly inserted, attached to, or otherwise placed into a cavity 20a through 30e. Further, it should be understood that the number of cavities shown in FIG. 2 is for illustrative purposes only; it being understood that their number may vary and still fall within the scope of the present invention.

As used herein the word "filter" may mean a single filter, such as an RF power or signal (analog or digital) filter, or one made of several components assembled in one or more cavities separated by bulkhead(s) (see FIGS. 8A and 8B), or a circuit board that includes filtering components, or a final assembly. In accordance with embodiments of the invention, a filter may be connected to either copper or optical fiber transmission lines. Yet further, a filter may include optical fiber, optical components, optical-to-electrical components, and/or electrical-to-optical components.

In accordance with embodiments of the invention, the shapes and sizes of the cavities 20a-20d and 30a-30e may be varied in order to properly receive a particular component.

Also shown is cavity 40 that is used to receive one or more communications type conduit, wiring, or cabling such as optical cables.

Figure 3:
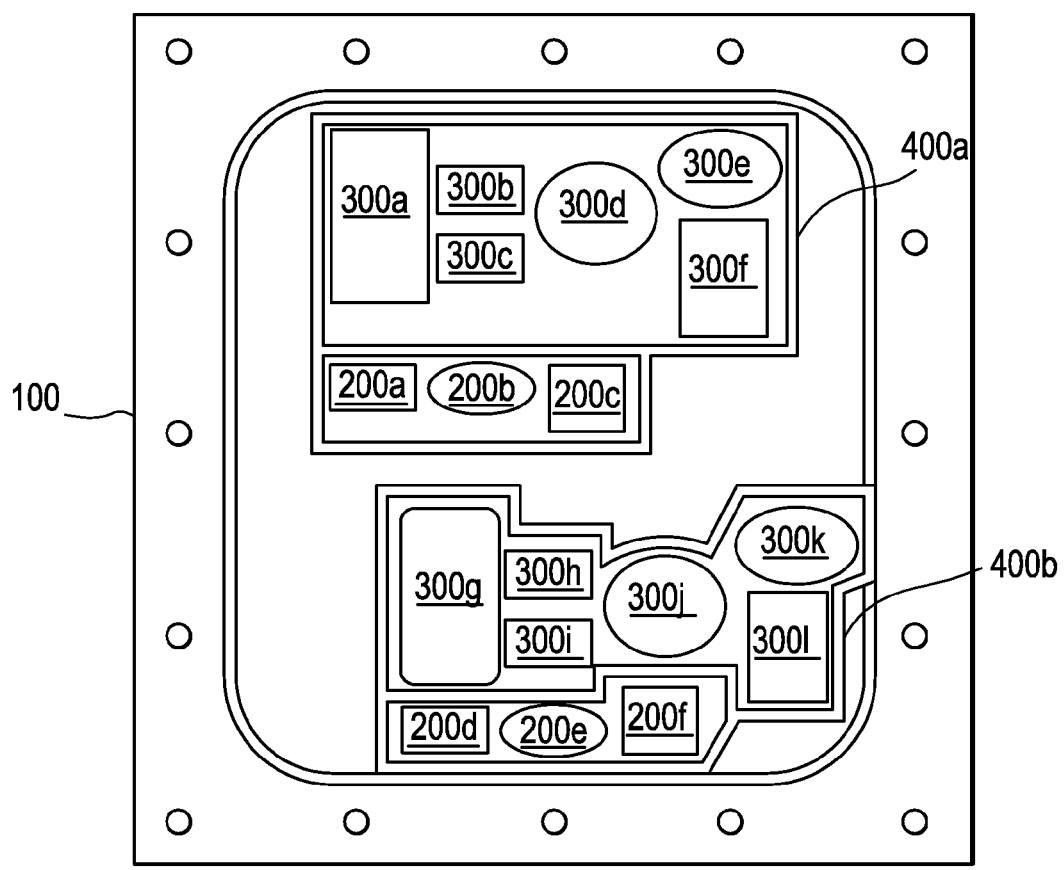

FIG. 3 depicts an alternative frame 100 that includes bulkheads or internal partitions 400a,400b, filled cavities 200a-f and spare cavities 300a-l according to another embodiment of the invention. As illustrated in FIGS. 2 and 3, the cavities may be arranged in a compact manner in order to make efficient use of the available space on the frames 10,100 so that machining of each cavity may be optimized around any component received by the cavities 200a through 300 l.

As is known in the art, because of the difficulty in bending or otherwise shaping thin metal in 3-dimensions with the precision required, most filters are formed using shapes that are the easiest to create, such as cylindrical or a "shoe box" designs (so-called "tin can" designs).

Realizing this, the present inventors provide for an optimized frame to receive filters and other components that may take the form of complex shapes that can be very accurately reproduced. CAD-based designs and CNC machining allow for the design and creation of such complex, yet precisely cut, shapes.

As mentioned above, the use of CAD designs and CNC machining also helps achieve the efficient and optimum use of available space on a frame, such as frame 100, so that the formation (e.g., machining) of each cavity may be optimized around any component received by cavities 20a-20d, 30a-30e and 200a through 300l. Given the type of components desired to be placed into a frame, and the desired frame size, the present invention provides optimum formed cavities, frames and components. FIGS. 2 and 3 are simplified illustrations of how cavities may be sized, shaped, positioned in a frame and placed with respect to other cavities in order to optimize space for a given design.

In accordance with embodiments of the invention, and as shown in FIGS. 1-10, cavities may be formed using parallel walls and still form very complex shapes.

Figure 4:
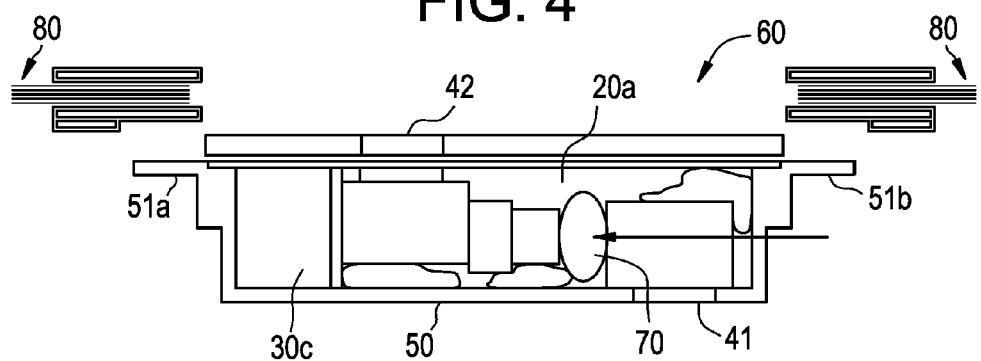
FIGS. 4-7 depict cross sectional views of assemblies according to embodiments of the invention.

Referring now to FIG. 4, there is shown a cross-sectional view of an assembly 60 taken along axis A-A of FIG. 2. As shown in this view, the assembly 60 includes a power and signal cartridge 50 with a filled cavity 20a and a spare cavity 30c. In one embodiment of the invention the filled cavity 20a may receive a power filter 70. Further, communication signals may be input into the filter 70 at one end 41 and output at another end 42. As shown the assembly 60 is oriented such that end 41 receives signals from sources outside a shielded enclosure 80 or the like (only a portion of the outer layer of enclosure 80 is shown) while end 42 outputs signals into the enclosure. Yet further, filter 70 may pass signals in both directions (i.e., into, and out of, the enclosure). The type of enclosure 80 may vary widely from a lightweight fabric to a more rigid, or sheet-metal based Tempest-like enclosure to give just a few examples.

Though referred to in the singular, it should be understood that the filter 70 may comprise one or more components (as shown in FIG. 4). In a further embodiment of the invention, when optical fiber is used to carry communication signals and the like into the enclosure 80 one or more additional components may be added to the cavity 20a or 30c or made a part of the filter 70 to allow for the transmission, filtering and/or conversion, if needed, of optical signals to electrical signals (O/E) and, if needed, conversion back from electrical signals to optical signals (E/O). In the case where no O/E or E/O conversions are necessary, the filter 70 and any additional component may be all optical components. Yet further, analog/digital optical converters, as well as passive and active optical components may be added to the cavity 20a or 30c or made a part of the filter 70 as required.

Also shown are variable flanges 51a and b for attaching the assembly to the enclosure 80. As shown in this embodiment, the assembly 60 protrudes outward from the enclosure 80.

The assembly 60 in FIG. 4 also depicts other features (e.g., potting wax or foam) which are evident from the figure itself and, thus, need not be discussed in detail or repeated here. In addition, rather than depict all of the various connections required to make the filter 70 shown in FIG. 4 operable such connections have been omitted for the sake of clarity, such connections being known to those skilled in the art. Similarly, in the assemblies shown in FIGS. 5-7 the internal and external connections, all known to those skilled in the art, have been omitted for the sake of clarity.

Figure 5:
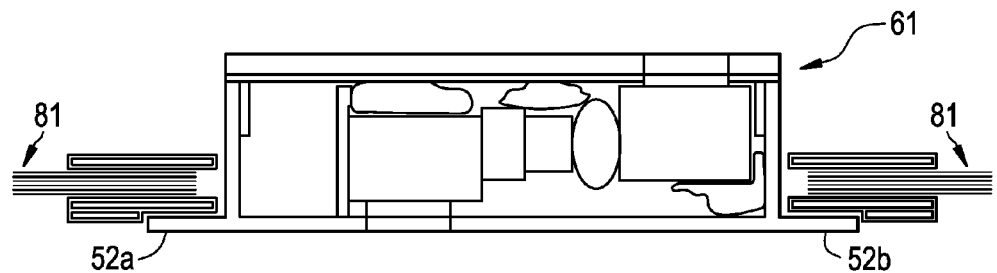

FIG. 5 depicts an alternative embodiment of an assembly 61 that is connected to an enclosure 81 in such a way (e.g., via flanges 52a, 52b) that the assembly protrudes into the enclosure 81.

Figure 6:
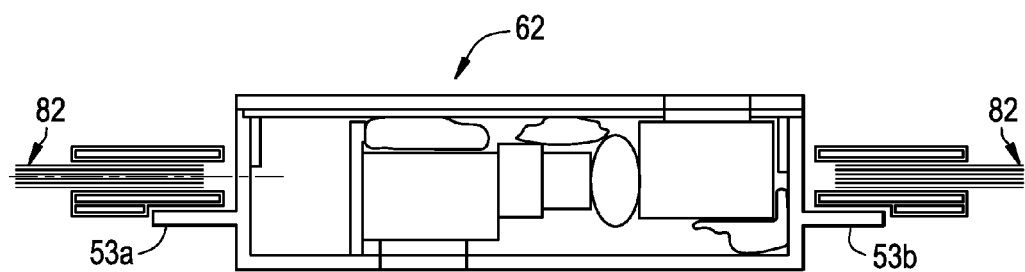

FIG. 6 depicts an alternative embodiment of an assembly 62 that is connected to an enclosure 82 by flanges 53a and b in such a way that the assembly 62 can be centered with respect to a perimeter of the enclosure 82 in order to minimize the dimensions of the assembly 62. As illustrated in FIGS. 4-7 the position of the flanges may be varied in order to provide different structural features and/or functions.

Figure 7:
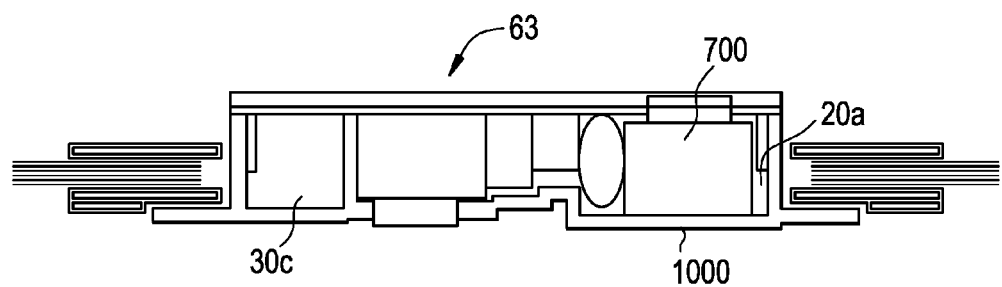

FIG. 7 depicts an alternative embodiment of an assembly 63, where the thickness of the frame 1000 may be varied in order provide a more compact, optimum and tight fit for components 700 received within cavity 20a. Said another way, the frame's 1000 thickness may be varied in accordance with the dimensions and other characteristics of the components 700 that are received by the cavity 20a.

Figure 8A:
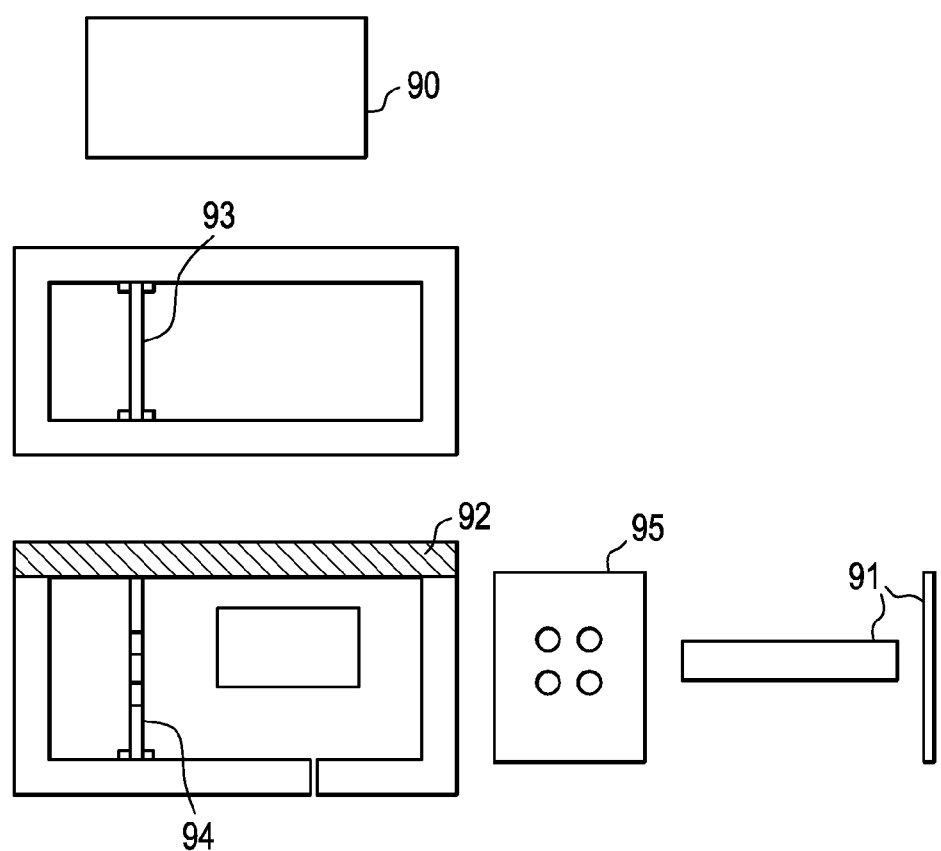

FIGS. 8A and 8B depict vertical and horizontal bulkheads 90-99. In one embodiment of the invention horizontal bulkheads may help provide physical, electrical and RF isolation of the filters and/or components placed within cavities. Such bulkheads may be connected to an assembly by any number of means, including soldering. In yet another embodiment of the invention, vertical bulkheads may also be included in an assembly to provide isolation as well. For ease of machining and assembly, it may be desirable to install components on a bulkhead prior to installing the bulkhead in an assembly.

Figure 9A:
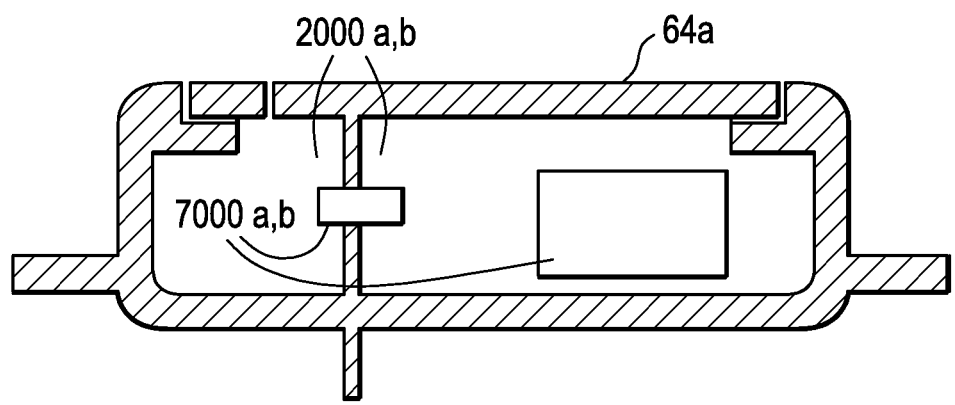
Figure 9B:
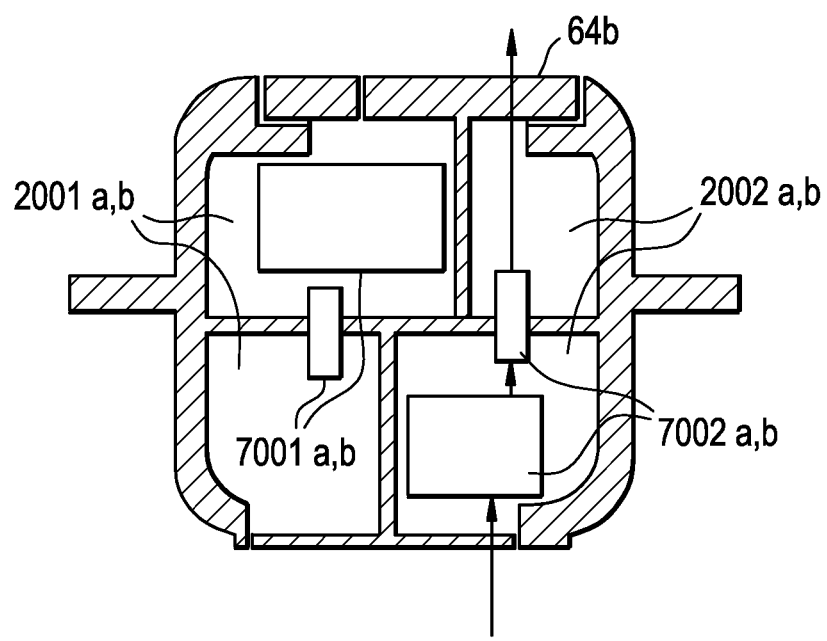

FIGS. 9A and 9B depict two additional, alternative assemblies 64a and b. As shown, the cavities 2000a,b and components 7000a,b included within assembly 64a form a single layer. In comparison, the cavities 2001a,b and 2002a,b and components 7001a,b and 7002a,b included within assembly 64b form two (or more layers).

FIG. 10 depicts a number of geometric shapes (e.g., square, circular, rectangular, rounded) that an assembly may take the form of, it being understood that the shapes shown are just some of the many shapes that an assembly may take the form of.

Figure 11:
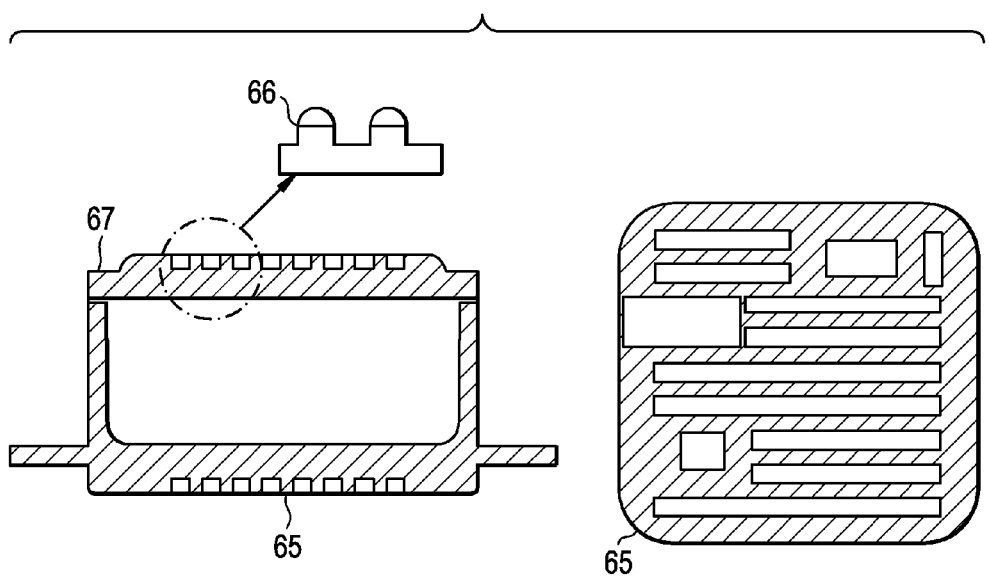
FIG. 11 depicts an assembly that includes heat sinks according to another embodiment of the invention.

FIG. 11 depicts the formation of one or more heat sinks 66 on a lid 67 of an assembly 65 according to one embodiment of the invention. Such heat sinks help dissipate heat from the assembly and its components.

Figure 12:
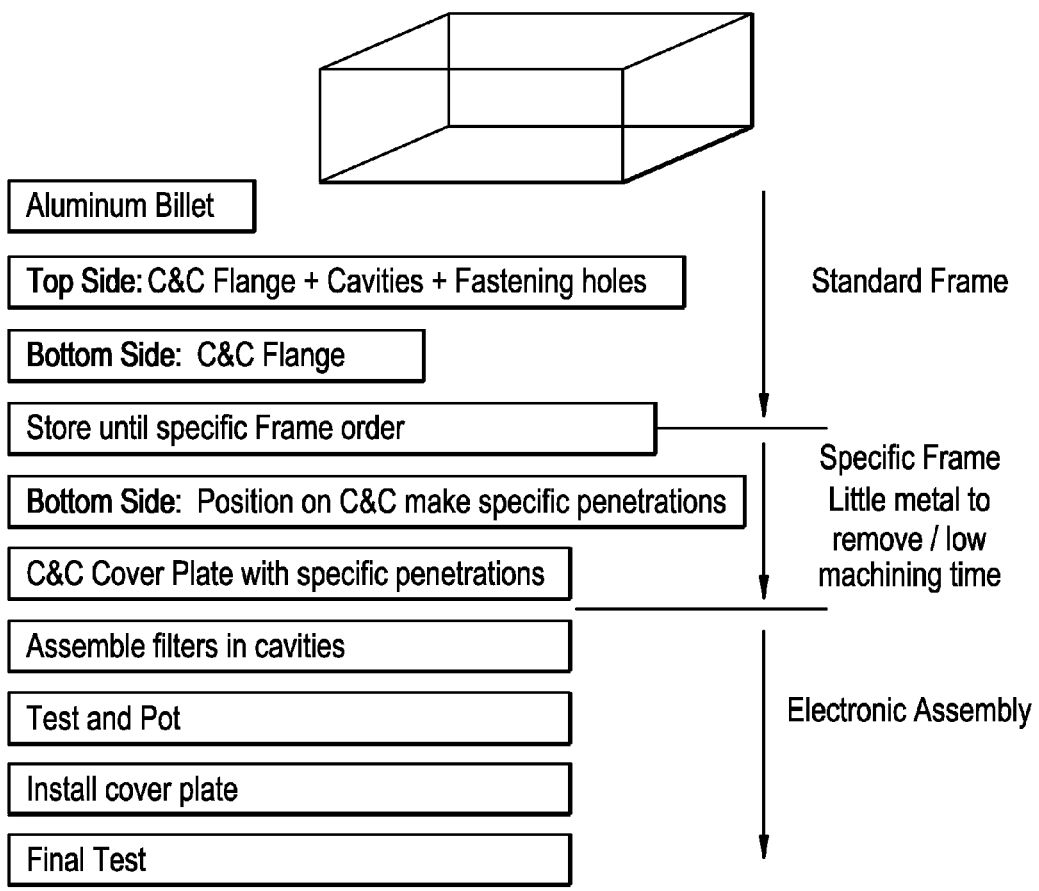
FIG. 12 depicts an exemplary manufacturing process according to one or more embodiments of the invention.

FIG. 12 depicts an exemplary manufacturing process which may be followed to make assemblies in accordance with aspects of the present invention.

Backtracking somewhat, it should be understood that machined, metal or metal alloy (e.g., aluminum) billets may be used as frames/assemblies in order to provide strength. Further, machined parts may receive a special surface treatment to allow increased conductivity, allow for soldering and reduce the risk of corrosion. Alternatively, as generally illustrated by some of the designs shown in FIG. 10 the frame may be made from a metal casting to realize efficient use of raw material and lower costs if large, production quantities are required.

The description above provides some examples of the scope of the present invention. It is not intended to be an exhaustive description of the many examples of the invention. Such a description would be impractical to write.

We claim:

1. An assembly comprising:
    an optimized frame comprising a plurality of internal and external bulkheads for providing isolation from external communication signals, wherein one of the internal isolating bulkheads further comprises a vertical bulkhead forming a partition of cavities, and another one of the internal isolating bulkheads further comprises a horizontal bulkhead forming a partition of the cavities;
    a first optimized cavity formed in a first shape of a first, associated electronic or optical component and configured to receive the first associated component;
    a second optimized cavity formed in a second shape of a second, associated electronic or optical component and configured to receive the second associated component, where the shape of the first and second cavities differ, and the first and second optimized cavities are arranged in a compact manner to make optimum use of space in the frame.

2. The assembly as in claim 1, wherein one of the electronic or optical components comprises a filter.

3. The assembly as in claim 2, wherein the filter comprises a radio-frequency (RF) power filter.

4. The assembly as in claim 2, wherein the filter comprises a RF signal filter.

5. The assembly as in claim 1 further comprising one or more radio-frequency identification (RFID) microchips.

6. The assembly as in claim 2, wherein one of the components comprises an electrical or optical connector.

7. The assembly as in claim 2, wherein one of the electronic or optical components comprises a signal connector.

8. The assembly as in claim 1 further comprising one or more flanges for attaching the assembly to an enclosure.

9. The assembly as in claim 1 further comprising one or more flanges for protrudingly attaching the assembly to an enclosure, allowing the assembly to protrude inside or outside a surface of the enclosure.

10. The assembly as in claim 1 further comprising one or more flanges for attaching the assembly to an enclosure and centering the assembly with respect to a perimeter of the enclosure.

11. The assembly as in claim 1, wherein a thickness of the frame is variable.

12. The assembly as in claim 1 wherein the assembly comprises a shaped assembly selected from at least the group consisting of square, circular, rectangular, and rounded.

13. The assembly as in claim 1 further comprising one or more heat sinks.

14. The assembly as in claim 1, wherein the assembly comprises a machined, metal billet.

15. The assembly of claim 14, wherein the metal billet comprises a metal alloy.

16. The assembly of claim 14, wherein the metal billet comprises an aluminum alloy.

17. The assembly as in claim 1 wherein the assembly comprises a machined, metal casting.

18. The assembly as in claim 1 wherein the assembly comprises an electrically conductive surface treated assembly.

19. A method for forming an assembly comprising:
    forming a plurality of internal and external bulkheads for providing isolation from external communication signals in a frame, wherein one of the internal isolating bulkheads further comprises a vertical bulkhead forming a partition of cavities, and another one of the internal isolating bulkheads further comprises a horizontal bulkhead forming a partition of the cavities;
    forming a first optimized cavity in a first shape of a first, associated electronic or optical component and to receive the first associated component;
    forming a second optimized cavity in a second shape of a second, associated electronic or optical component and to receive the second associated component, where the shape of the first and second cavities differ;
    arranging the first and second optimized cavities in a compact manner in the frame to make optimum use of space in the frame.

20. The method as in claim 19, wherein one of the electronic or optical components comprises a RF power or signal filter.

21. The method as in claim 19 further comprising attaching the assembly to an RF-shielded enclosure.

22. The assembly as in claim 2, wherein one of the associated electronic or optical components comprises an optical fiber.

23. The assembly as in claim 18 wherein the electrically conductive surface treated assembly further comprises a metal surface treatment.

24. The method as in claim 19 further comprising applying an electrically conductive surface treatment.

25. The method as in claim 24 further comprising applying a metal surface treatment.

* * * * *